(12) United States Patent
Lou

(10) Patent No.: US 6,177,308 B1
(45) Date of Patent: Jan. 23, 2001

(54) METHOD FOR MANUFACTURING STACKED CAPACITOR

(75) Inventor: Chine-Gie Lou, Hsinchu Hsien (TW)

(73) Assignee: Worldwide Semiconductor Manufacturing Corp., Hsinchu (TW)

(*) Notice: Under 35 U.S.C. 154(b), the term of this patent shall be extended for 0 days.

(21) Appl. No.: 09/299,963

(22) Filed: Apr. 26, 1999

(30) Foreign Application Priority Data

Mar. 30, 1999 (TW) .................................................. 88104982

(51) Int. Cl.[7] .............................................. H01L 21/8242
(52) U.S. Cl. .......................................... 438/253; 438/255
(58) Field of Search ..................... 438/253–256, 438/393–399

(56) References Cited

U.S. PATENT DOCUMENTS 5,597,756 * 1/1997 Fazan et al. .

* cited by examiner

Primary Examiner—Jey Tsai
(74) Attorney, Agent, or Firm—J.C. Patents; Jiawei Huang

(57) ABSTRACT

A method for stacked capacitor. The method utilizes a silicon nitride layer as an etching stop layer for removing the insulation layer on each side of a crown-shaped capacitor structure. As soon as the insulation layer is removed the silicon nitride layer is removed as well. In addition, a high-temperature oxide layer is formed over the inter-layer dielectric. The high-temperature oxide layer can prevent the formation of hemispherical grains on its surface when selective hemispherical grains are formed on the surface of an amorphous silicon layer.

11 Claims, 5 Drawing Sheets

METHOD FOR MANUFACTURING STACKED CAPACITOR

CROSS-REFERENCE TO RELATED APPLICATION

This application claims the priority benefit of Taiwan application serial no. 88104982, filed Mar. 30 1999, the full disclosure of which is incorporated herein by reference.

BACKGROUND OF THE INVENTION

1. Field of Invention

The present invention relates to a method for manufacturing the capacitor of a semiconductor memory cell. More particularly, the present invention relates to a method for manufacturing the stacked capacitor of dynamic random access memory (DRAM).

2. Description of Related Art

As semiconductor device manufacturing progresses into the deep sub-micron range, dimensions of each semiconductor are all reduced. One consequence of this is the reduction of space for accommodating a capacitor. In contrast the size of software needed to operate a computer is forever growing, and hence the needed memory capacity must be increased. In the presence of these conflicting requirements, some changes have to be made regarding the design of DRAM capacitors.

A stacked capacitor structure is the principle type of capacitor to be used in manufacturing semiconductor memory. The stacked type of capacitor has been used for quite some time and continues to be used, even in deep sub-micron device fabrication.

A Stacked capacitors can be roughly classified into crown-shaped, fin-shaped, cylinder-shaped or spread-out type. Although any of these stacked capacitors is able to satisfy the high density requirement of DRAMs, simply using such conventional structures to fabricate the capacitor can hardly go beyond 256 megabit (Mb) memory capacity.

Capacitance, however, can be increased by increasing the surface area of the lower electrode of, say, a crown-shaped capacitor so that higher memory capacity becomes possible. For example, the surface area of the lower electrode can be further increased by growing hemispherical grains (HSGs) on the lower electrode surface.

FIGS. 1A through 1E are cross-sectional views showing the progression of manufacturing steps in fabricating a conventional double-sided crown-shaped capacitor.

First, as shown in FIG. 1A, a substrate 100 having a number of devices (not shown) thereon is provided. Next, a silicon oxide layer 102 and a silicon nitride layer 104 are sequentially formed over the substrate 100. The silicon oxide layer 102 serves as an inter-layer dielectric (ILD) while the silicon nitride layer 104 serves as an etching stop layer during the fabrication of the double-sided crown-shaped capacitor. Both the silicon oxide layer 102 and the silicon nitride layer 104 can be formed using a chemical vapor deposition (CVD) method, for example.

Thereafter, photolithographic and etching operations are conducted to form a contact opening 106 that passes through the silicon oxide layer 102 and the silicon nitride layer 104. Next, a doped polysilicon plug is formed inside the contact opening 106. The doped polysilicon plug can be formed by first depositing a layer of doped polysilicon (not shown in the figure) over the silicon nitride layer 104 and filling the contact opening 106 using a chemical vapor deposition (CVD) method. Then, the doped polysilicon layer above the silicon nitride layer 104 is removed using, for example, a reactive ion etching (RIE) method.

Next, as shown in FIG. 1B, an insulation layer 108 is formed over the silicon nitride layer 104. The insulation layer 108 can be formed using, for example, a chemical vapor deposition (CVD) method. The insulation layer 108 is made, for example, from borophosphosilicate glass (BPSG). Thereafter, an opening 110 that exposes the contact opening 106 is formed using photolithographic and etching techniques.

Next, as shown in FIG. 1C, an amorphous silicon layer 112 conformal to the opening 110 and surrounding areas is formed. The amorphous silicon layer 112 is formed using, for example, a low-pressure chemical vapor deposition (LPCVD) method.

Next, as shown in FIG. 1D, using the insulation layer 108 as an polishing stop layer, the amorphous silicon layer 112 above the insulation layer 108 are removed. Hence, only the amorphous silicon layer 112 inside the opening 110 remain. The method of removing portions of the amorphous silicon layer 112 includes a chemical-mechanical polishing (CMP) method.

Next, as shown in FIG. 1E using the silicon nitride layer 104 as an etching stop layer the insulation layer 108 above the silicon nitride layer 104 is removed using a wet etching method, for example. Hence, a crown-shaped capacitor structure is obtained.

Thereafter, selective hemispherical grains are formed on the exposed amorphous silicon surface. Next, dielectric material is deposited to form a capacitor dielectric layer, and then an upper electrode is formed over the capacitor dielectric layer to form the double-sided crown-shaped capacitor. Since subsequent operations should be to familiar to those skilled in the art of semiconductor manufacture, detailed descriptions are omitted here.

However, the silicon nitride layer 104 to be used as an etching stop layer during the removal of the insulation layer 108 can be easily turned into a surface with hemispherical grains in the selective hemispherical grain growing process. Since the presence of hemispherical grains on the surface of the silicon nitride layer 104 is highly undesirable, the hemispherical grains must be removed, causing additional processing complexity and yield reducibility.

FIGS. 2A and 2B are cross-sectional views showing the structure before and after an operation for removing the native oxide from a conventional contact opening just before forming a barrier metal and a tungsten plug inside.

First, as shown in FIG. 2A, due to a capacitor processing requirements, two sides of a high aspect ratio (VIAR) contact opening 200 may include two silicon oxide layers 202a and 202b sandwiched between a silicon nitride layer 204, instead of just the two silicon oxide layers 20a and 202b.

In FIG. 2B, a cleaning operation for removing native oxide on the exposed surface 208 of the substrate 206 is carried out before forming a barrier metal and a tungsten plug inside the contact opening 200 so that reliability of the subsequently formed a metal plug can be maintained.

However, the silicon nitride layer 204 usually has an etching rate that differs from the two silicon oxide layers 202a and 202b. Consequently, after the native oxide removing process, protrusion of the silicon nitride layer 204 from the sidewalls of the contact opening 200 may result, thereby leading to difficulties in producing an uniform titanium and titanium nitride barrier metal in subsequent process.

In light of the foregoing, there is a need to improve the method of manufacturing double sided crown-shaped capacitor.

SUMMARY OF THE INVENTION

Accordingly, the purpose of the present invention is to provide a method of manufacturing a stacked capacitor that utilizes a silicon nitride layer as an etching stop layer for the removal of an insulation layer on each side of the crown-shaped lower electrode structure. In addition, a special high temperature oxide (HTO) that cannot form any hemispherical grain on its surface when selective hemispherical grains are grown on an amorphous silicon layer is used in place of the conventional silicon nitride layer. Hence, the present invention resolves the problem of forming hemispherical grains on the surface of a silicon nitride layer when it is used as an etching stop layer.

To achieve these and other advantages and in accordance with the purpose of the invention, as embodied and broadly described herein, the invention provides a method of forming stacked capacitor. The method includes the steps of providing a substrate. and then forming a inter-layer dielectric layer over the substrate. Next, a contact opening is formed in the inter-layer dielectric layer, and then a conductive plug is formed inside the contact opening. Thereafter, an etching stop layer is formed over the so inter-layer dielectric layer, and then an insulation layer is formed over the etching stop layer. Subsequently, an opening is formed that passes through the insulation layer and the etching stop layer and exposes the conductive plug. Next, a crown-shaped amorphous silicon layer is formed. Then, the insulation layer and the etching stop layer are sequentially removed. Finally, a plurality of hemispherical grains is formed on the exposed surface of the crown-shaped amorphous silicon layer.

According to this invention, a silicon nitride layer is formed and serves as an etching stop layer for removing the insulation layer on each side of the crown-shaped capacitor structure. Thereafter, the silicon nitride layer is removed. Since the inter-layer dielectric is already covered by a high temperature oxide (HTO), hemispherical grains cannot form on its exposed surface when selective hemispherical grains are grown on the amorphous silicon layer.

In this invention, the silicon nitride layer itself is removed after the insulation layer on each side of the crown-shaped structure is removed. Moreover, a high temperature oxide incapable of growing hemispherical grains is formed on the surface of the inter-layer dielectric so that hemispherical grains do not grow outside the amorphous silicon layer of crown-shaped structure. Therefore, there is no need to schedule all operation for the specific removal of the hemispherical grains from the surface of the inter-layer dielectric and yield of production can be increased.

In addition, the method of this invention can also resolve the protruding phenomenon happened in the sidewalls of a conventional high aspect ratio contact opening after native oxide is removed from the exposed substrate surface.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
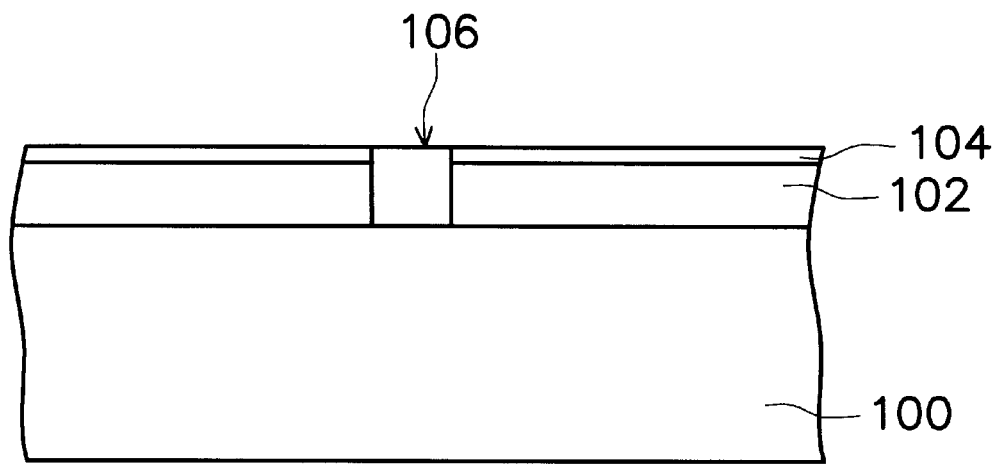
FIGS. 1A through 1E are cross-sectional views showing the progression of manufacturing steps in fabricating a conventional double-sided crown-shaped capacitor.
Figure 1B:
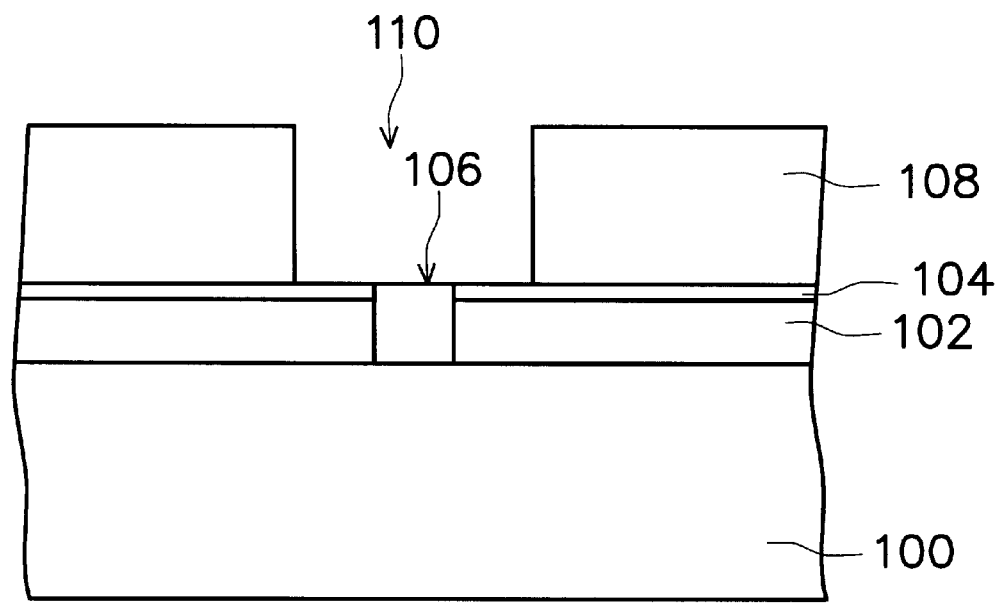
Figure 1C:
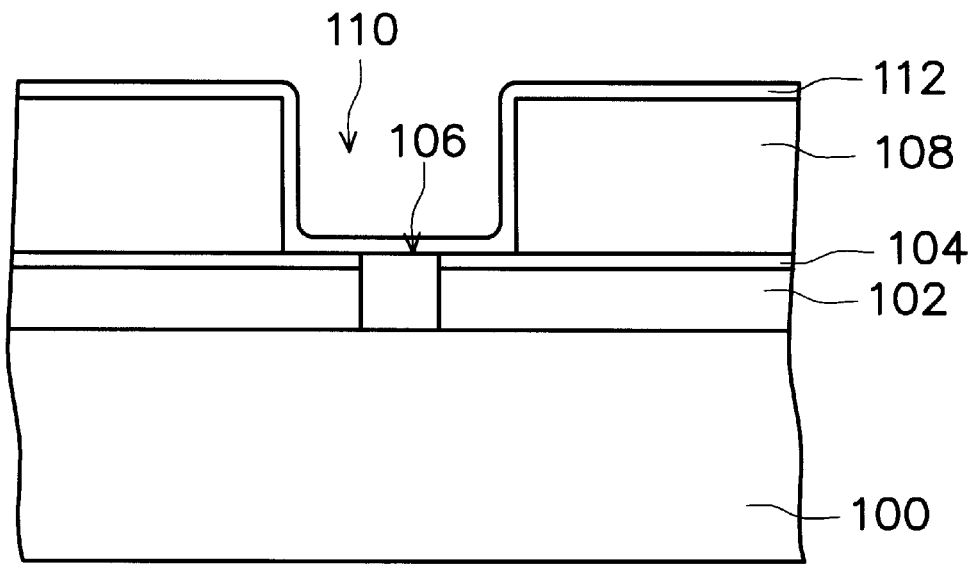
Figure 1D:
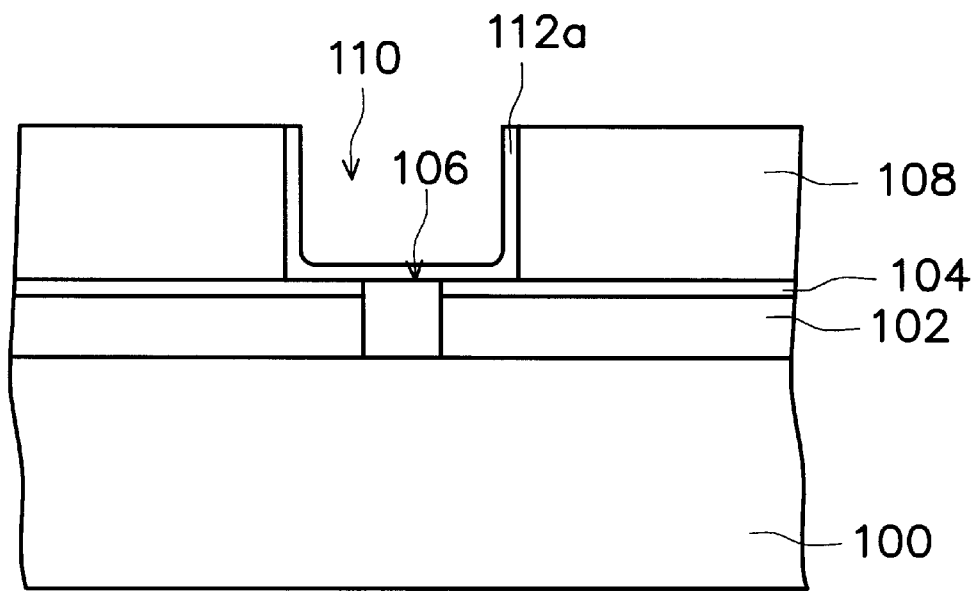
Figure 1E:
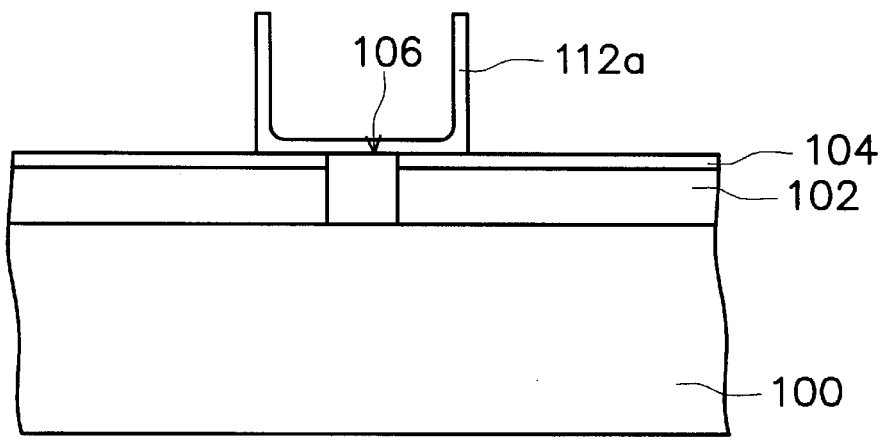
Figure 2A:
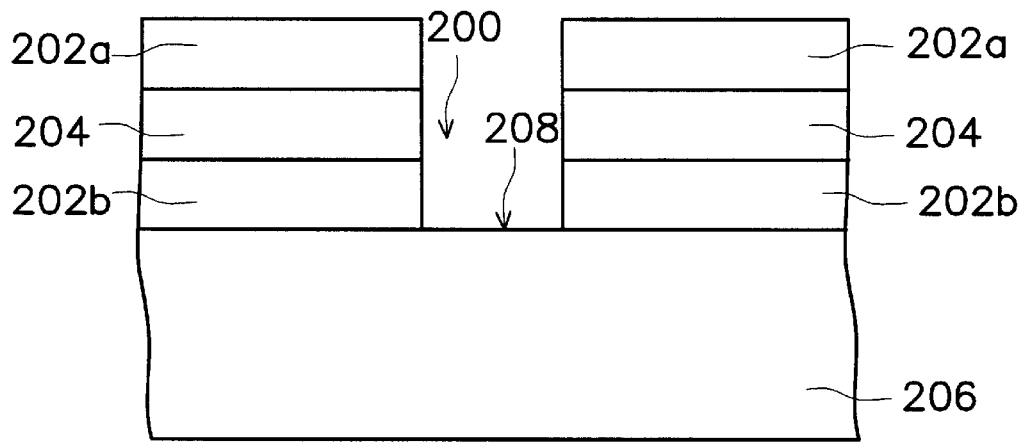
FIGS. 2A and 2B are cross-sectional views showing the structure before and after an operation for removing the native oxide from a conventional contact opening just before forming a barrier metal and a tungsten plug inside.
Figure 2B:
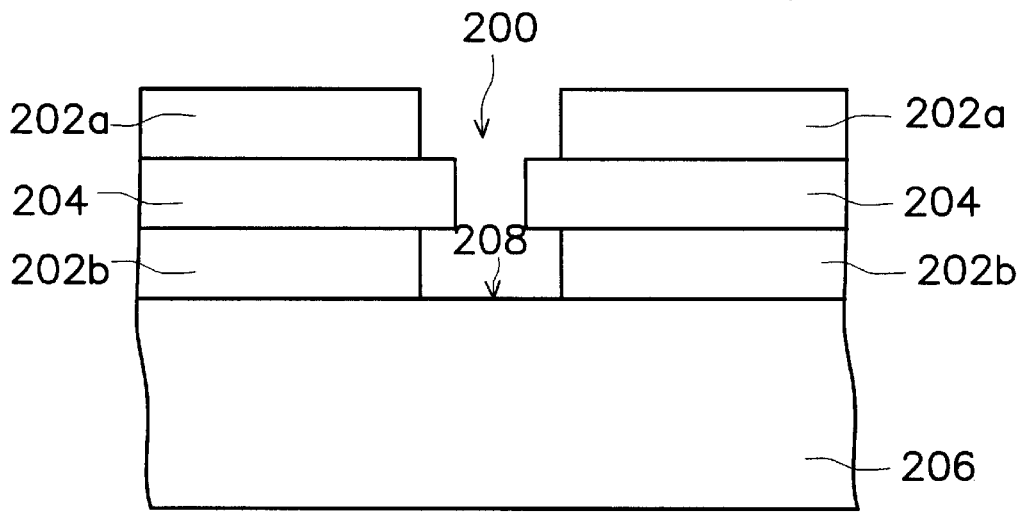

Reference now be made in detail to the present preferred embodiments of the invention examples of which are illustrated in the accompanying drawings. Wherever possible the same reference numbers are used in the drawings and the description to refer to the same or like parts.

FIGS. 3A through 3E are cross-sectional views showing the progression of manufacturing steps in fabricating a double-sided crown-shaped capacitor according to this invention.

Figure 3A:
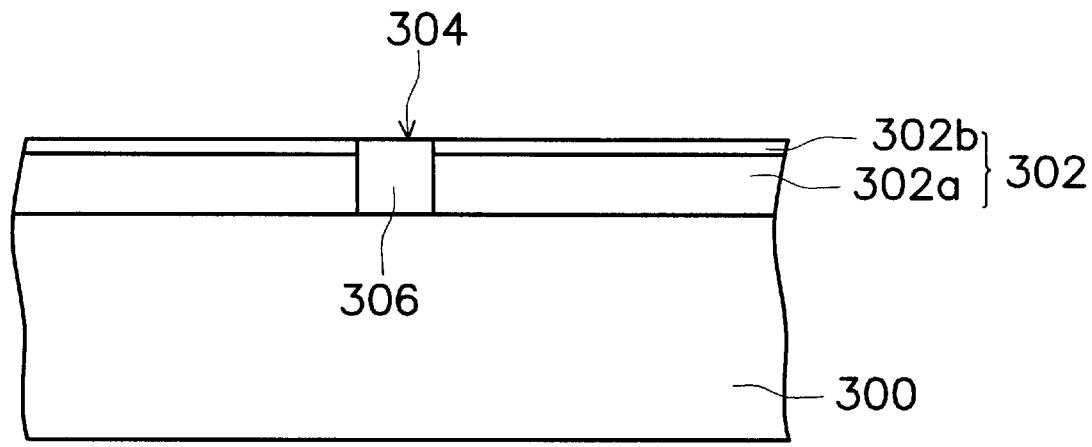
FIGS. 3A through 3E are cross-sectional views showing the progression of manufacturing steps in fabricating a double-sided crown-shaped capacitor according to this invention.

As shown in FIGS. 3A a substrate 300 having a number of devices thereon is provided. A dielectric layer 302 is formed over the substrate 300. The dielectric layer 302 serves as an inter-layer dielectric and includes a silicon oxide layer 302a and a high-temperature oxide layer 302b. The silicon oxide layer 302a and the high-temperature oxide layer 302b are formed using a chemical vapor deposition (CVD) method.

Thereafter, photolithographic and etching techniques are used to form a contact opening 304 that passes through the silicon oxide layer 302a and the high-temperature oxide layer 302b. A conductive plug 306 is formed inside the contact opening 304. The conductive plug, 306 is formed by first depositing a conductive layer (not shown in the figure) over the dielectric layer 302 and completely filling the contact opening 304 using, for example, a chemical vapor deposition (CVD) method. Then, the conductive layer above the dielectric layer 302 is removed using, for example, a reactive ion etching method. The conductive plug 306 can be made, for example, from doped polysilicon whose dopant concentration is preferably around 5E19 atoms/cm$^3$.

Figure 3B:
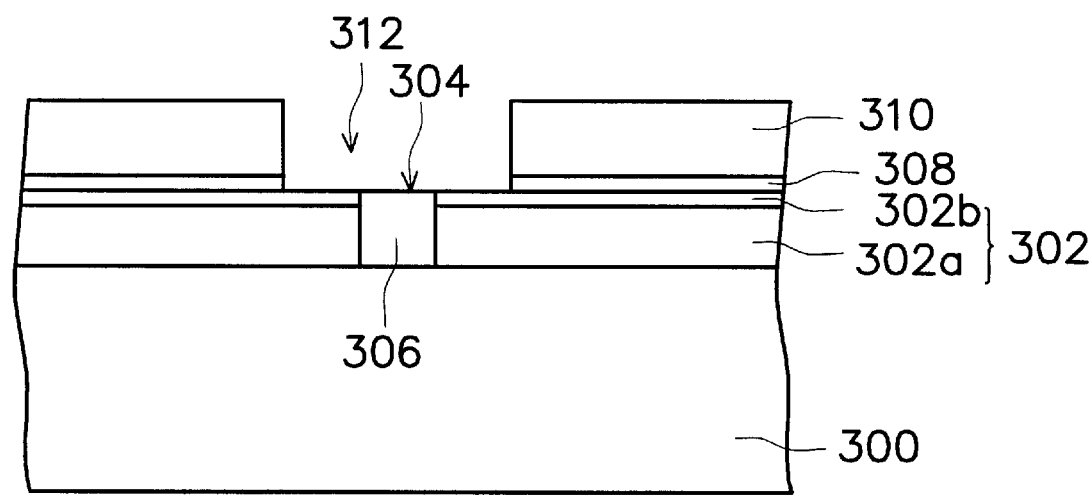

As shown in FIG. 3B, an etching stop layer 308 is formed over the dielectric layer 302. The etching stop layer 308 can be a silicon nitride layer formed using, for example, a chemical vapor deposition (CVD) method. Thereafter, an insulation layer 310 is formed over the etching stop layer 308. The insulation layer 310 can be a silicon oxide layer formed by a plasma enhanced chemical vapor deposition (PECVD) process using tetra-ethyl-ortho-silicate (TEOS) as the gaseous reactant, for example. Then, photolithographic and etching techniques are used to form an opening 312 in the insulation layer 310 and the etching stop layer 308 so that the conductive plug 306 is exposed.

Figure 3C:
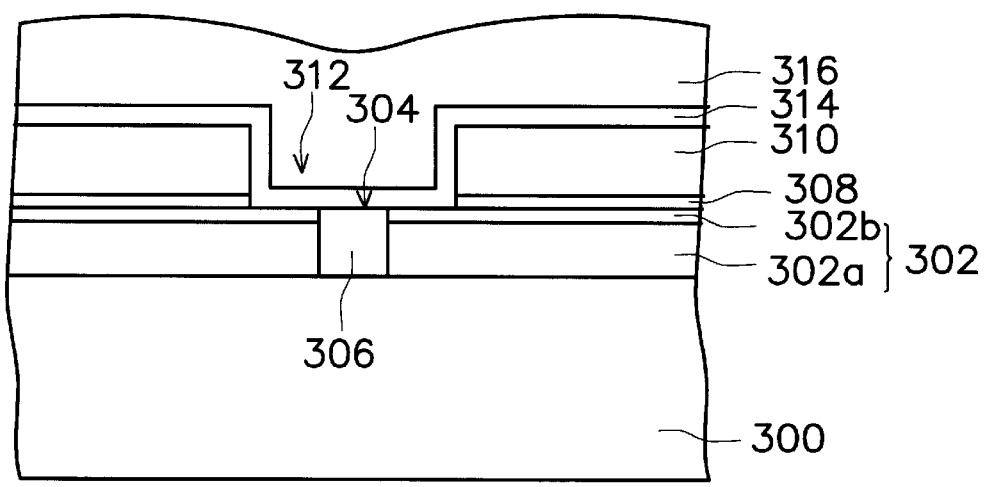

As shown in FIG. 3C, an amorphous silicon layer 314 conformal to the opening no 312 and the surroundings insulation layer 310 is formed. The amorphous silicon layer 314 can be formed, for example, using a low-pressure chemical vapor deposition (LPCVD) method at a temperature of between 510° C. to 520° C. Moreover, the amorphous silicon layer 314 can be further doped using conductive ions. In the subsequent step, a spin-on-glass (SOG) layer 316 is formed over the amorphous silicon layer 314 so that the opening 312 is also filled.

Figure 3D:
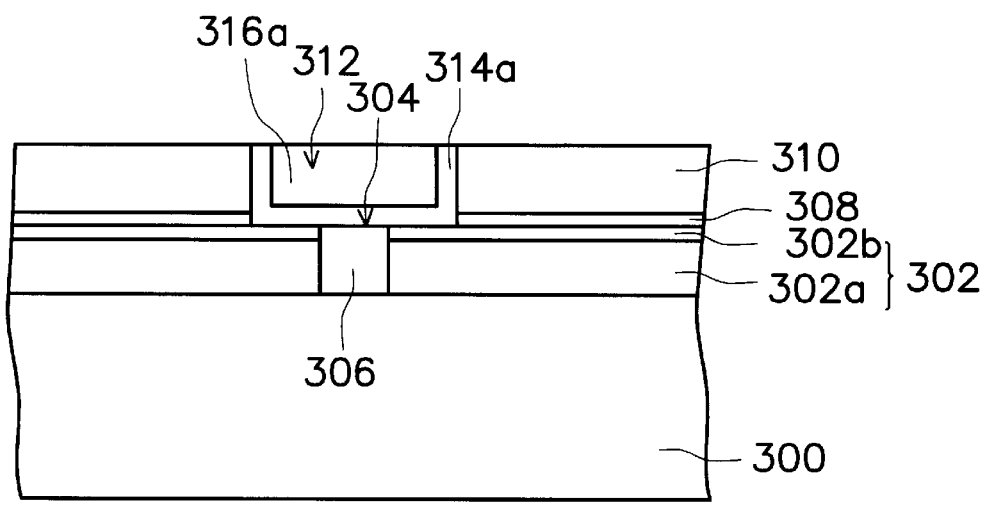
Figure 3E:
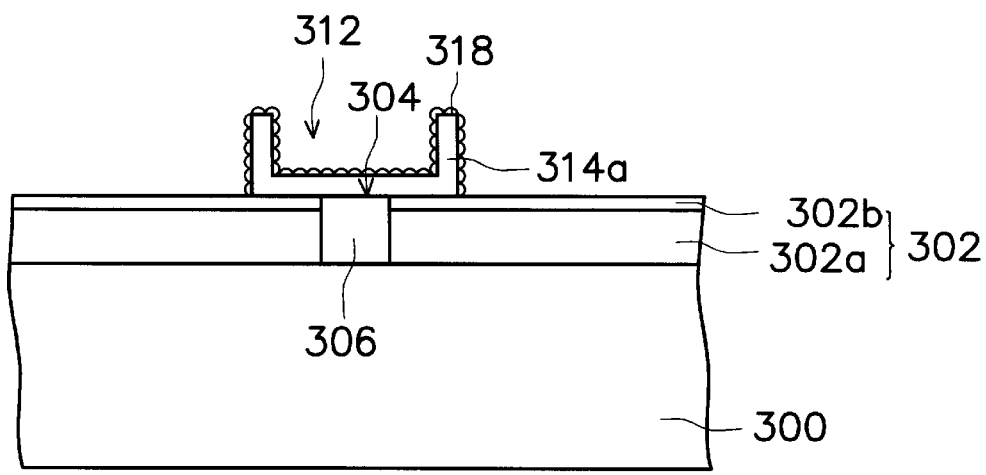

As shown in FIG. 3D, the spin-on-glass layer 316 and the amorphous silicon layer 314 above the insulation layer 310 are removed using the insulation layer 310 as an etching stop layer. Finally, only a portion of the spin-on-glass layer 316a and the amorphous silicon layer 314a remain inside the opening 312. The spin-on-glass layer 316 and the amorphous silicon layer 314 above the insulation layer 310, for example, are removed using a reactive ion etching method.

As shown in FIG. 3F, thereafter, the spin-on-glass layer 316a inside the opening 312 and the insulation layer 310 are also removed by a wet etching method using the etching stop layer 308 as an etching stop layer. Ultimately, only the crown-shaped amorphous silicon layer 314a remains.

The etching stop layer 308 is removed using, for example, hot phosphoric acid ($H_3PO_4$). Subsequently, a multitude of hemispherical grains 3 18 is formed on the exposed surface of the crown-shaped amorphous silicon layer 314a. The hemispherical grains 318 are formed over the amorphous silicon layer 314a by first seeding nuclei for forming hemispherical grains 318 over the crown-shaped amorphous silicon layer 314a. The seeding can be done using silane ($SiH_4$) or disilane ($Si_2H_6$) in a high vacuum (about $10^{-3}$ to $10^{-4}$ Torr). Next, a heat treatment is carried out, in an ultra high vacuum (about $10^{-8}$ to $10^{-9}$ Torr) so that silicon atoms inside the crown-shaped amorphous silicon layer 314a are able to migrate towards the respective nuclei. Finally, the nuclei are grown into heinispherical grains 318.

Since subsequent operations for forming a complete stacked capacitor are familiar to those skilled in semiconductor manufacture, detailed description is omitted.

In short, this invention uses a silicon nitride layer to serve as an etching stop layer for removing the insulation layer on each side of the crown-shaped structure. Thereafter the silicon nitride layer itself is removed. Furthermore, the inter-layer dielectric is a composite layer having a high-temperature oxide layer on top so that hemispherical grains are not formed when selective hemispherical grains are grown on the amorphous silicon surface.

In this invention, the silicon nitride layer itself is removed after the insulation layer on each side of the crown-shaped structure is removed. Moreover, a high temperature oxide incapable of growing hemispherical grain is formed on the surface of the inter-layer dielectric so that hemispherical grains do not grow outside the amorphous silicon layer of crown-shaped structure. Therefore there is no need to schedule an operation for the specific removal of the hemispherical grains from the surface of the inter-layer dielectric. Hence, yield of production can be increased.

This invention uses a spin-on-glass layer to manufacture a capacitor of crown-shaped structure. Hence, cost of production can be lowered and process window can be increased.

In addition, the method of this invention can also resolve the protruding phenomenon happened in the sidewalls of a conventional high aspect ratio contact opening after native oxide is removed from the exposed substrate surface.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a stacked capacitor, comprising the steps of:
   providing a substrate;
   forming a dielectric layer including a high temperature oxide layer over the substrate;
   forming a conductive plug inside the contact opening;
   forming an etching stop layer over the dielectric layer;
   forming an insulation layer over the etching stop layer;
   forming an opening that passes through the insulation layer and the etching stop layer so that the conductive plug is exposed;
   forming a crown-shaped amorphous silicon layer;
   removing the insulation layer and the etching stop layer; and
   forming a plurality of hemispherical grains over the exposed surface of the crown-shaped amorphous silicon layer.

2. The method of claim 1, wherein the step of forming the conductive plug includes depositing doped polysilicon to form a doped polysilicon plug.

3. The method of claim 1, wherein the step of forming the etching stop layer includes depositing silicon nitride to form a silicon nitride layer.

4. The method of claim 1, wherein the step of forming the insulation layer includes depositing silicon oxide to form a silicon oxide layer using tetra-ortho-silicate-glass (TEOS) as a gaseous reactant.

5. The method of claim 1, wherein the step of forming the crown-shaped amorphous silicon layer includes the sub-steps of:
   forming an amorphous silicon layer conformal to the insulation layer and the opening;
   forming a spin-on-glass layer over the amorphous silicon layer;
   removing the spin-on-glass layer and the amorphous silicon layer above the insulation layer; and
   removing the spin-on-glass layer inside the opening.

6. The method of claim 1. wherein the step of forming the crown-shaped amorphous silicon layer includes depositing in-situ doped amorphous silicon layer.

7. A method for manufacturing stacked capacitor, comprising the steps of:
   providing a substrate;
   forming a dielectric layer over the substrate;
   forming a high temperature oxide layer over the dielectric layer;
   forming a contact opening that passes through the high temperature oxide layer and the dielectric layer;
   forming a conductive plug inside the contact opening;
   forming a silicon nitride layer over the high temperature oxide layer;
   forming an insulation layer over the silicon nitride layer;
   forming an opening that passes through the insulation layer and the silicon nitride layer so that the conductive plug is exposed;
   forming a crown-shaped amorphous silicon layer;
   removing the insulation layer;
   removing the silicon nitride layer; and
   forming a plurality of hemispherical grains over the exposed surface of the crown-shaped amorphous silicon layer.

8. The method of claim 7, wherein the step of forming the conductive plug includes depositing doped polysilicon to form a doped polysilicon plug.

9. The method of claim 7, wherein the step of forming the insulation layer includes depositing silicon oxide to form a silicon oxide layer using tetra-ortho-silicate-glass (TEOS) as a gaseous reactant.

10. The method of claim 7, wherein the step of forming the crown-shaped amorphous silicon layer includes the sub-steps of:

forming an amorphous silicon layer conformal to the insulation layer and the opening;

forming a spin-on-glass layer over the amorphous silicon layer;

removing the spin-on-glass layer and the amorphous silicon layer above the insulation layer; and removing the spin-on-glass layer inside the opening.

11. The method of claim 7, wherein the step of forming the crown-shaped amorphous silicon layer includes depositing in-situ doped amorphous silicon layer.

* * * * *